United States Patent
Miyamoto

(10) Patent No.: US 7,189,681 B2
(45) Date of Patent: Mar. 13, 2007

(54) SUPERCONDUCTING MATERIAL AND METHOD FOR PRODUCING THE SAME

(75) Inventor: Yoshiyuki Miyamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 949 days.

(21) Appl. No.: 10/025,473

(22) Filed: Dec. 26, 2001

(65) Prior Publication Data

US 2002/0086800 A1 Jul. 4, 2002

(30) Foreign Application Priority Data

Dec. 22, 2000 (JP) .............................. 2000-390715

(51) Int. Cl.
*C04B 101/00* (2006.01)
*C01B 31/00* (2006.01)

(52) U.S. Cl. .................. 505/122; 505/110; 505/460

(58) Field of Classification Search ............... 505/122, 505/460, 110; 423/445 B, DIG. 39, DIG. 40
See application file for complete search history.

(56) References Cited

U.S. PATENT DOCUMENTS 5,278,239 A * 1/1994 Hoxmeier ................... 525/232

FOREIGN PATENT DOCUMENTS

| JP | 5-17114 | 1/1993 |
| JP | 8-264038 | 10/1996 |
| JP | 188507 A | 7/1997 |
| JP | 9-255319 | 9/1997 |
| JP | 9-295803 | 11/1997 |
| JP | 2800473 | 7/1998 |
| JP | 2002-193606 | * 7/2002 |
| WO | WO 93/19007 | * 9/1993 |

OTHER PUBLICATIONS

Margadonna et al "High Pressure Polymerization of Li-Intercalated Fulleride Li3CsC60", Chem. Mater. 1999, 11, 2960-2965.*
Makarova et al "Magnetism in C60 induced by polymerization", Proc. Electrochem. Soc. 2002, vol. 12, Dec. 2002 (Abstract Only).*
A. Devos et al., "Electron-phonon coupling for aromatic molecular crystals: Possible consequences for their super-conductivity", Physical Review B, vol. 58, No. 13, Oct. 1, 1996.
H. Prinzbach et al., Gas-phase production and photoelectron spectroscopy of the smallest fullerene, $C_{20}$, Nature, vol. 407, Sep. 2000.

* cited by examiner

*Primary Examiner*—Mark Kopec
(74) *Attorney, Agent, or Firm*—Young & Thompson

(57) ABSTRACT

For provides a superconducting material comprising highly chemically stable Fullerene carbon molecules having a relatively high transition temperature and high chemical stability, $C_{20}$ Fullerene molecules having stronger electron-lattice interaction than that of $C_{60}$ Fullerene molecules are used, in order to polymerize the $C_{20}$ Fullerene molecules into a one-dimensional chain, $C_{20}$ is incorporated in a gap of a material having a large band gap between a valence band and a conduction band, thereafter, electrons or positive holes are injected into the obtained $C_{20}$ Fullerene chain polymer via an electric field application for phase transition to a superconductor.

8 Claims, 4 Drawing Sheets

Change in electric resistance of one-dimensional $C_{20}$ chain by temperature

Resistance (/resistance at room temperature)

Temperature (K)

FIG.1(a)
FIG.1(b)
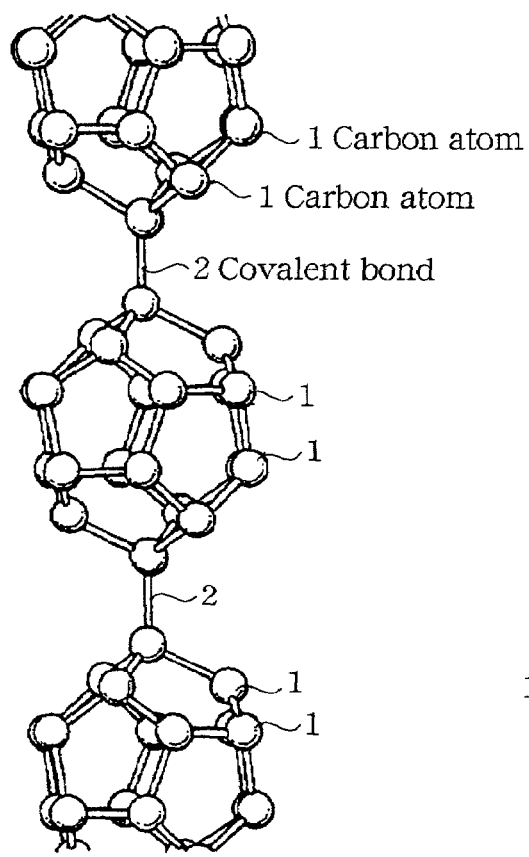
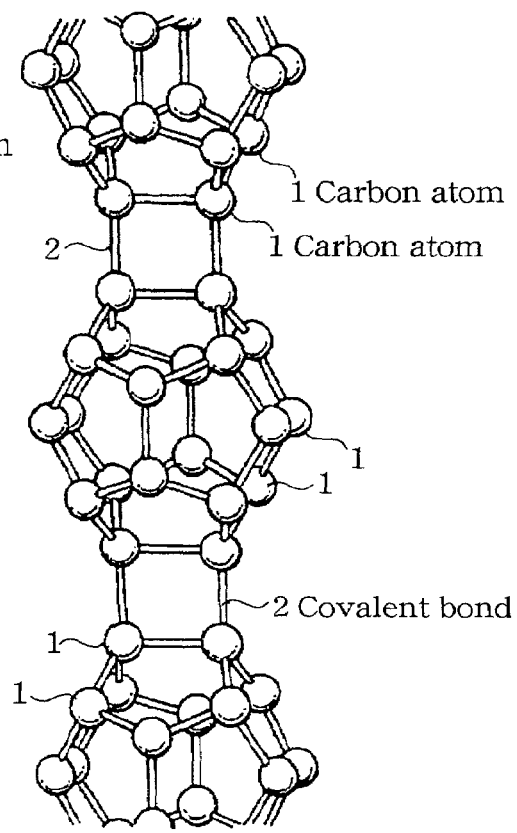

3 π-electron orbits

3 π-electron orbits

3 π-electron orbits

3 π-electron orbits

SUPERCONDUCTING MATERIAL AND METHOD FOR PRODUCING THE SAME

FIELD OF THE INVENTION

The present invention relates to a superconducting material, more particularly, a carbon Fullerene superconducting material and a method for producing the same.

BACKGROUND OF THE INVENTION

Fullerene is a soccer-ball-shaped molecule which consists of an arrangement of carbon atoms with a hollow inside. As a conventional carbon Fullerene superconducting material, alkali-doped $C_{60}$ Fullerene molecules are known to exert superconductivity. An oxide superconductor is also known as a high-temperature superconducting material.

However, superconducting transition temperature of such an alkali-doped $C_{60}$ Fullerene molecule is as low as 40K at maximum, rendering it unpractical for use under a relatively high temperature. An oxide superconductor that exerts superconductivity at the temperature of liquefied nitrogen is poor in chemical stability and thus is not quite appropriate to be used in an electric circuit material that requires fine fabrication. Other superconducting material consisting of carbon Fullerene molecules smaller than $C_{60}$ molecules has not been achieved.

Thus, the present invention has an objective of providing a superconducting material in which $C_{20}$ Fullerene molecules are polymerized into a one-dimensional chain, where bonding portions between $C_{20}$ Fullerene molecules are bound via a $SP^3$-bond form, or no $sp^3$-bond is contained other than at the bonding portions between $C_{20}$ Fullerene molecules, or where the superconducting material is obtained by injection of electrons or positive holes.

SUMMARY OF THE INVENTION

In view of the above-described problems, the present invention is characterized by a superconducting material comprising a structure wherein $C_{20}$ Fullerene molecules are polymerized into a one-dimensional chain. The present invention is further characterized in that $C_{20}$ Fullerene molecules are bound via $sp^3$-bond, in that no $sp^3$-bond exists other than the bonding portion between the $C_{20}$ Fullerene molecules or in that the superconducting material is obtained by injection of electrons or positive holes.

According to the present invention, $C_{20}$ Fullerene having a stronger electron-lattice interaction than that of $C_{60}$ Fullerene is employed. By polymerizing the $C_{20}$ Fullerene molecules into a one-dimensional chain in a porous material, and injecting electrons or positive holes into the obtained material, a superconductor with a transition temperature of the level of 100 K can be realized. The chemical stability of the superconducting material which $C_{20}$ Fullerenes is polymerized in the porous material is superior over that of the oxide superconductor. Accordingly, a superconducting material with a higher superconducting transition temperature and higher chemical stability can be obtained.

BRIEF DESCRIPTION OF THE DRAWINGS

FIG. 1A is a view showing chain structure of polymerized $C_{20}$ Fullerene molecules bound via a single C—C covalent bond, and FIG. 1B is a view showing chain structure of a double C—C covalent bond, respectively;

DETAILED DESCRIPTION OF THE INVENTION

Hereinafter, an embodiment of the present invention will be described with reference to the drawings.

In order to polymerize $C_{20}$ Fullerene molecules into a one-dimensional chain, $C_{20}$ is incorporated in a gap of a material having a large band gap between a valence band and a conduction band. Preferably, this material is a BN nanotube or zeolite. Here, the BN nanotube is a tubular material that is formed from, instead of carbons, boron nitrides (BN) that are arranged in a stacked honeycomb layers. The BN nanotube have been available domestically and overseas since 1997 or around. To such a chain-form $C_{20}$ Fullerene molecular polymer, electrons or positive holes are injected via an electric field application for phase transition to a superconductor. The method will be described below.

The $C_{20}$ Fullerene molecule is a cage-shape molecule made up only of five-membered rings. These molecules can polymerize in a one-dimensional manner at an activation energy of 0.8 eV or less, as analyzed by the first-principle calculation. FIGS. 1A and 1B show two one-dimensional chain structures of different types of $C_{20}$ Fullerene molecules. In FIG. 1A, $C_{20}$ Fullerene molecules made of carbon atoms 1 are bound to each other via a single C—C covalent bond 2. On the other hand, in FIG. 1B, $C_{20}$ Fullerene molecules made of carbon atoms 1 are bound to each other via a double C—C covalent bond 2. That is, there is two single C—C covalent bond between adjacent molecules. In both of the one-dimensional chain structures, each of the bonding portions between the $C_{20}$ Fullerene molecules is bound via a single C—C bond with a bond length of 1.5 [angstrom], and a bond angle at the bonding portion approximating the bond angle of a diamond (about 105 [degree]). Thus, the $C_{20}$ Fullerene molecules are bound via $sp^3$-bond forming a regular tetrahedron while no $sp^3$-bond can be found other than at the bonding portions between the $C_{20}$ Fullerene molecules.

Figure 2A:
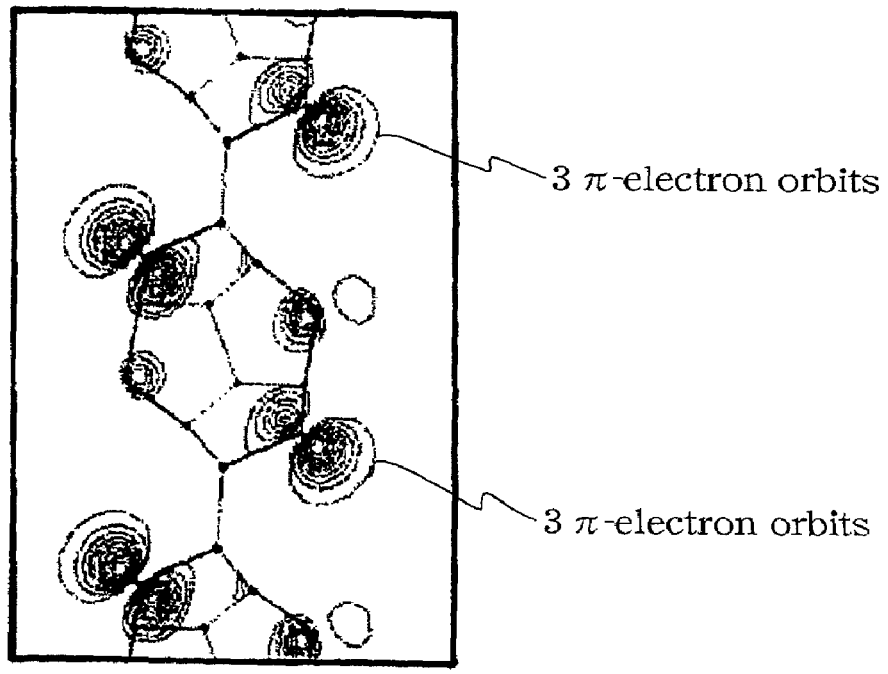
FIG. 2A is a view showing distribution of π-electron orbits localized on $C_{20}$ Fullerene molecules corresponding to the FIG. 1A.
Figure 2B:
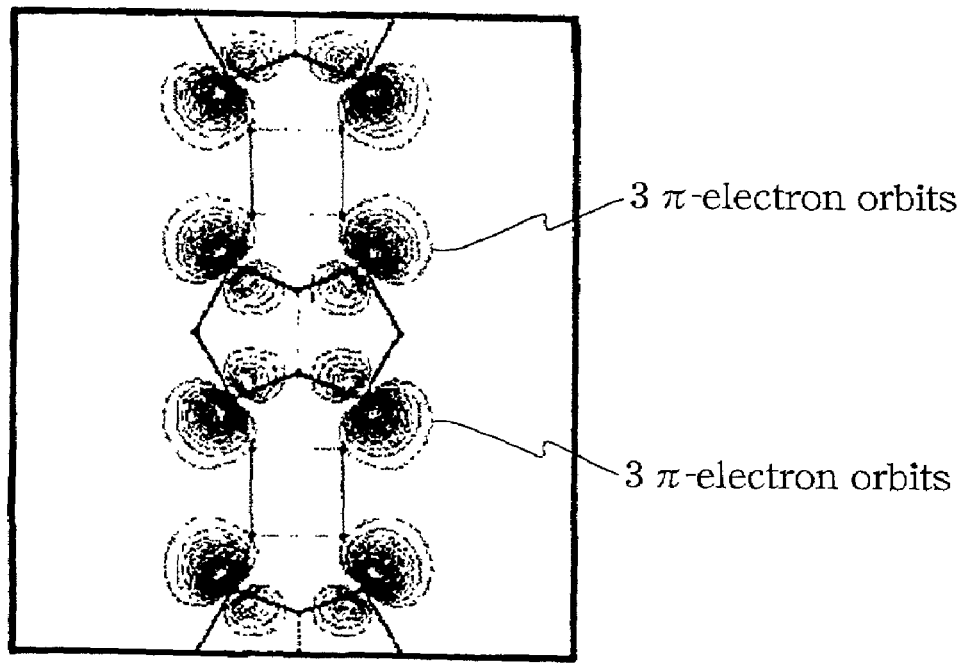
FIG. 2B is a view showing distribution of π-electron orbits localized on $C_{20}$ Fullerene molecules corresponding to the FIGS. 1B, respectively.

Due to this structure, in both of the one-dimensional chain structures shown in FIGS. 1A and 1B, wave functions (π-electrons) at the top of the valence band and the bottom of the conduction band of this material are localized only on the surfaces of the $C_{20}$ Fullerenes separated from the bonding portions as shown in FIGS. 2A and 2B, respectively. The distributions of π-electron orbits 3 shown in FIGS. 2A and 2B correspond to the structures shown in FIGS. 1A and 1B, respectively. Due to this localization, the electrons and the positive holes are less likely to hop from one $C_{20}$ Fullerene molecule to an adjacent $C_{20}$ Fullerene molecule. Thus, dispersion of energy bands at the top of the valence band and the bottom of the conduction band can be small, thereby generating high state density. Thus, electrons or positive holes are doped to balance the energy levels of these bands with the Fermi level, thereby obtaining a metal state with high state density at Fermi level. Due to this high state density and strong electron-lattice interaction inside the $C_{20}$ Fullerene molecules, the chain substance made of the $C_{20}$ Fullerene molecules exerts superconductivity with a transition temperature in the order of 100 K.

According to the theoretical prediction by Devos and Lannoo (A. Devos and M. Lannoo, Phys. Rev. B, Vol. 58 (No. 13), p8236 (2000)), the electron-lattice interaction of $C_{20}$ is about three times stronger than that of $C_{60}$. This can be explained by simple physics that the electron-lattice interaction is in inverse proportion to the number of carbon atoms contained in the Fullerene. On the other hand, according to a simulation by the first-principle calculation, the doping amount has to be such that the number of electrons or positive holes per $C_{20}$ Fullerene molecule is one or less. Thus, the state density that can be achieved in the vicinity of the Fermi level is about half the state density obtained with the $C_{60}$ Fullerene molecule. According to the BCS (Bardeen, Cooper, Schrieffer) theory of superconductivity, a superconducting transition temperature is in proportion to exponential of the product of the electron-lattice interaction and the state density at the Fermi level. Therefore, the transition temperature of $C_{20}$ Fullerene molecule is $e^{3/2}$ times (about 4.5 times) higher than the superconducting transition temperature of $C_{60}$ Fulllerene molecule (40 K) and can be expected to be as large as 180 K which is comparable to a transition temperature of a high-temperature superconducting material.

Figure 3:
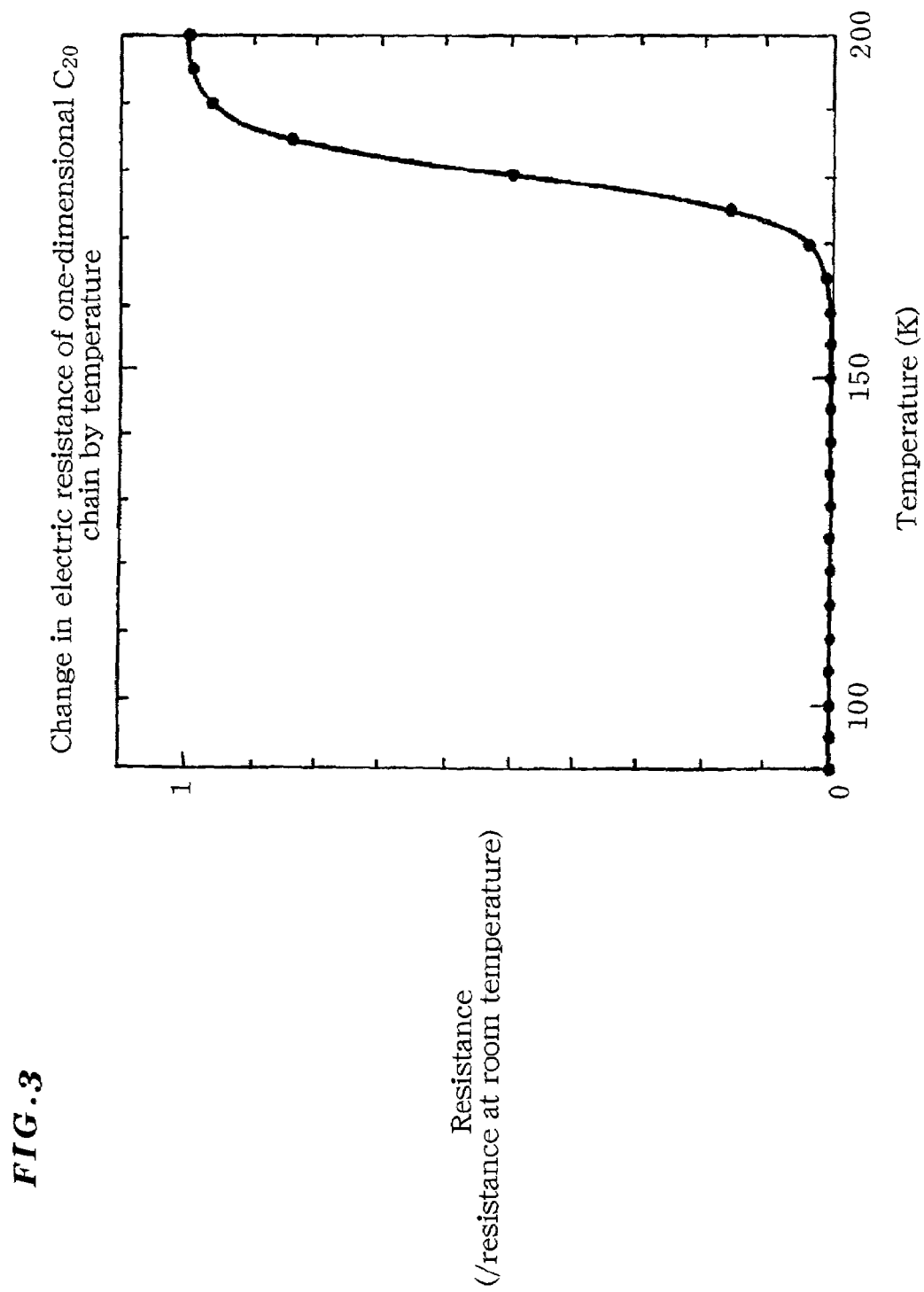
FIG. 3 is a graph showing change in electric resistance of a one-dimensional $C_{20}$ chain by temperature.

In view of the above-described consideration, FIG. 3 shows the simulated results of a change in electric resistance by temperature. The resistance values are not absolute values and are normalized such that the resistance at room temperature is 1. According to the first-principle calculation, when $C_{20}$ Fullerene molecules are polymerized in a three-dimensional manner, they undergo phase transition and relax from a closed cage structure to an open structure. Since such phase transition weakens the electron-lattice interaction, three-dimensional polymerization has to be avoided.

Figure 4:
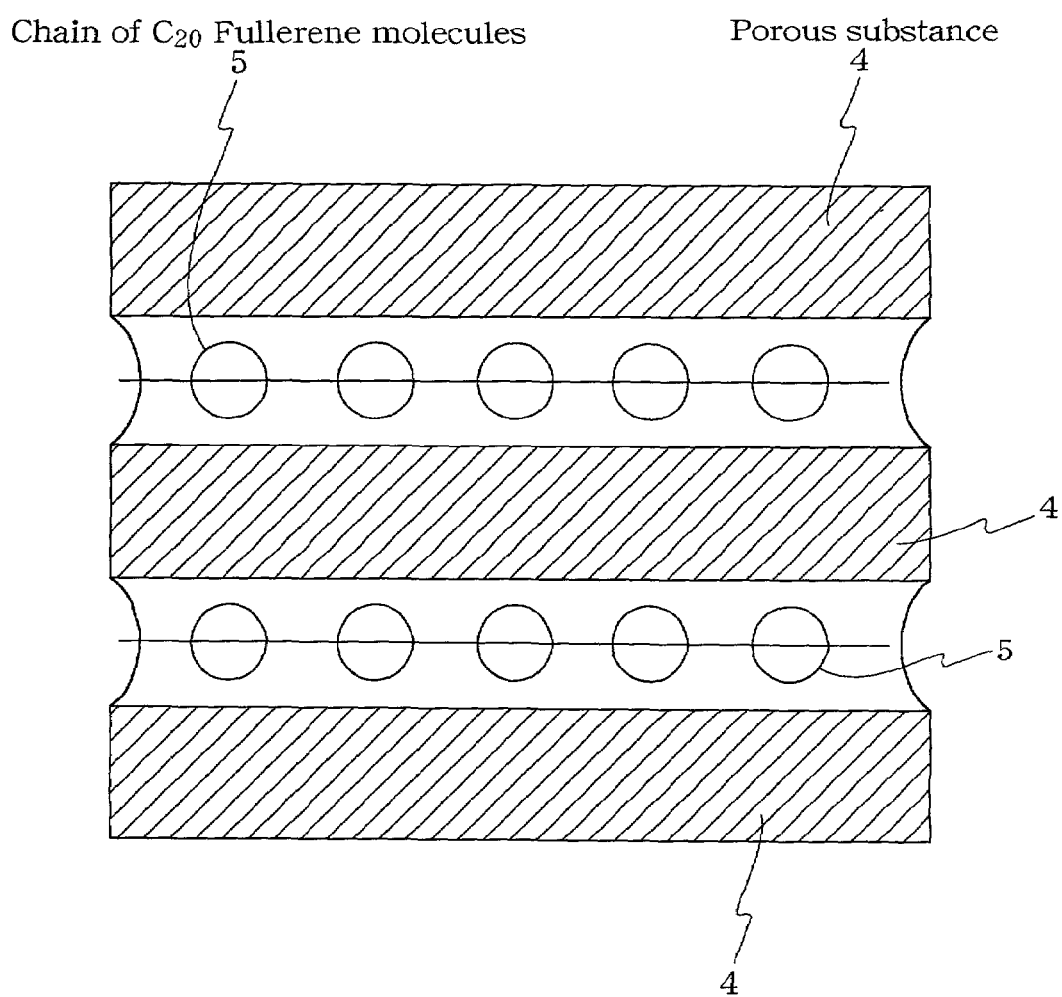
FIG. 4 is a schematic view showing the chains of $C_{20}$ Fullerene molecules in a porous material, generated through polymerization reaction.

The above-mentioned chain substance can be produced according to the following procedure to avoid the undesirable three-dimensional polymerization. First $C_{20}$ Fullerene molecules in a gas state are produced according to Prinzbach et al. (see Prinzbach et al., Nature (London), Vol. 407 (2000) p60). Then, using capillarity, the $C_{20}$ Fullerene molecules are incorporated into a porous material having a large band gap between the valence band and the conduction band, such as zeolite or a BN nanotube. As a result, spontaneous polymerization reaction takes place at about room temperature, thereby producing a chain polymer 5 of $C_{20}$ Fullerene molecules in the porous substance 4 as shown in FIG. 4.

An electric field application technique is employed to inject electrons or positive holes in such a chain substance of $C_{20}$ Fulllerene molecules produced in the porous material. Since the chain of the $C_{20}$ Fullerene molecules has filled in the voids that had existed in the porous material, there is no space for other molecule to fill in. Accordingly, the $C_{20}$ Fullerene molecular chain is chemically stable. The entire sample is mounted on a silicon substrate that has been doped with boron (acceptor) at a high concentration, and applied with a strong electric field. Electrons are doped if the sample side is positive, while positive holes are doped if the sample side is negative. A silicon substrate doped with donors may also be used. In this case, however, the electric field has to be adjusted to control the doping amount.

By considering the stability according to the first-principle calculation, the superconducting transition temperature is at maximum when the number of doped electrons (or doped positive holes) per $C_{20}$ Fullerene molecule is less than 1, and no superconductivity appears when the number is 1 or more. The electric structure according to the first-principle calculation shows that the effective potential difference between the $C_{20}$ Fullerene chain substance and the silicon substrate needs to be controlled to be 0.5 eV or less.

According to the present invention, $C_{20}$ Fullerene molecules having stronger electron-lattice interaction than that of $C_{60}$ Fullerene molecules are used. By polymerizing this $C_{20}$ Fullerene molecules into a one-dimensional chain in a porous substance, and injecting electrons or positive holes into the obtained porous material, a superconductor with a transition temperature of the level of 100 K can be realized. The chemical stability of the substance obtained by polymerizing $C_{20}$ Fullerenes in the porous material is superior over that of an oxide superconducting material. Thus, a superconducting material having high superconducting transition temperature as well as excellent chemical stability can be obtained.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2000-390715 (filed on Dec. 22, 2000) including specification, claims, drawings and summary are incorporated herein by reference in its entirety. The invention may be embodied in other specific forms without departing from the spirit or essential characteristic thereof.

What is claimed is:

1. A superconducting material comprising a structure wherein $C_{20}$ Fullerene molecules are polymerized into a one-dimensional chain.

2. A superconducting material according to claim 1, wherein $C_{20}$ Fullerene molecules are bound via $sp^3$-bond.

3. A superconducting material according to claim 2, wherein no $sp^3$-bond exists other than bonding portions between the $C_{20}$ Fullerene molecules.

4. A superconducting material according to claims 1, wherein the material having a structure obtained by injection of electrons or positive holes.

5. A superconducting material according to claims 2, wherein the material having a structure obtained by injection of electrons or positive holes.

6. A superconducting material according to claims 3, wherein the material having a structure obtained by injection of electrons or positive holes.

7. A method for producing a superconducting material. comprising the steps of:
  incorporating and polymerizing $C_{20}$ Fullerene molecules in a porous material which has a large band gap between a valence band and a conduction band;
  mounting the porous material incorporating the $C_{20}$ Fullerene molecules on a semiconductor substrate doped with an acceptor or a donor; and
  applying electric field to the porous material.

8. A method for producing a superconducting material according to claim 7, wherein the porous material having a large band gap is zeolite or a BN nanotube.

* * * * *